US007426709B1

United States Patent
Ganesan

(10) Patent No.: US 7,426,709 B1
(45) Date of Patent: Sep. 16, 2008

(54) AUTO-GENERATION AND PLACEMENT OF ARBITRATION LOGIC IN A MULTI-MASTER MULTI-SLAVE EMBEDDED SYSTEM

(75) Inventor: Satish R. Ganesan, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 389 days.

(21) Appl. No.: 11/198,785

(22) Filed: Aug. 5, 2005

(51) Int. Cl.
*G06F 17/50* (2006.01)
*G06F 13/00* (2006.01)
*G06F 13/36* (2006.01)

(52) U.S. Cl. ............... 716/16; 716/1; 716/17; 716/18; 710/110; 710/113; 710/317

(58) Field of Classification Search ............ 716/1, 716/16, 17, 18; 714/7, 11, 12; 710/110, 710/113, 305, 317; 330/129; 326/38
See application file for complete search history.

(56) References Cited

U.S. PATENT DOCUMENTS

| | | | | |
|---|---|---|---|---|
| 5,915,102 A * | 6/1999 | Chin | ............... | 710/113 |
| 6,034,542 A * | 3/2000 | Ridgeway | ............... | 326/39 |
| 6,243,829 B1 * | 6/2001 | Chan | ............... | 714/7 |
| 6,467,010 B1 * | 10/2002 | Pontius et al. | ............... | 710/305 |
| 6,507,243 B2 * | 1/2003 | Harris et al. | ............... | 330/129 |
| 6,665,855 B2 * | 12/2003 | Payne et al. | ............... | 716/18 |
| 6,779,170 B1 * | 8/2004 | Montrym | ............... | 716/17 |
| 6,785,755 B1 * | 8/2004 | Holm et al. | ............... | 710/110 |
| 6,917,998 B1 * | 7/2005 | Giles | ............... | 710/300 |
| 6,959,428 B2 * | 10/2005 | Broberg et al. | ............... | 716/18 |
| 6,968,514 B2 * | 11/2005 | Cooke et al. | ............... | 716/1 |
| 6,978,397 B2 * | 12/2005 | Chan | ............... | 714/12 |
| 7,007,121 B1 * | 2/2006 | Ansari et al. | ............... | 710/113 |
| 7,076,595 B1 * | 7/2006 | Dao et al. | ............... | 710/317 |
| 7,130,942 B2 * | 10/2006 | Gemelli et al. | ............... | 710/105 |
| 7,183,796 B2 * | 2/2007 | Leijten-Nowak | ............... | 326/38 |
| 7,246,185 B1 * | 7/2007 | Pritchard et al. | ............... | 710/110 |
| 7,266,632 B2 * | 9/2007 | Dao et al. | ............... | 710/317 |
| 7,310,594 B1 * | 12/2007 | Ganesan et al. | ............... | 703/13 |
| 2003/0204831 A1 * | 10/2003 | Payne et al. | ............... | 716/18 |

OTHER PUBLICATIONS

Hwang et al.; "An improved implementation method of AHB BusMatrix"; Sep. 25-28, 2005; SOC Conference, 2005. Proceedings. IEEE International; pp. 211-214.*
Pelgrims, Patrick et al., "Embedded Systeemontwerp op basis van Soft-en Hardcore FPGA's", *AMBA Avalon CoreConnect Wishbone*, pp. 1-6, v 1.1, available from De Nayer Instituut, J. De Nayerlaan 5, B-2860 Sint-Katelijne-Waver, Tel. (015) 31 69 44.

* cited by examiner

*Primary Examiner*—Helen Rossoshek
(74) *Attorney, Agent, or Firm*—Thomas A. Ward; Joseph P. O'Malley; Kevin T. Cuenot

(57) ABSTRACT

An FPGA design system includes the use of constraints in order to determine whether to associate arbitration logic with a bus or in slave modules. In one embodiment, area constraints can be used to determine whether a smaller design using arbitration logic at the bus should be used. In one embodiment, a latency constraint is used to determine whether a lower latency design with arbitration logic at the slave modules is to be used. In one embodiment, throughput constraints are used to determine whether a higher throughput design with arbitration logic at the slave modules is to be used.

16 Claims, 7 Drawing Sheets

AUTO-GENERATION AND PLACEMENT OF ARBITRATION LOGIC IN A MULTI-MASTER MULTI-SLAVE EMBEDDED SYSTEM

BACKGROUND

1. Technical Field

The present invention relates to methods and systems for producing logic on an FPGA. More particularly, the present invention relates to a system for communication between logic on an FPGA that uses multiple master modules and multiple slave modules.

2. Related Art

On a programmable logic device (PLD), such as a field programmable gate array (FPGA), designs can be programmed or instantiated into Configurable Logic Blocks (CLBs) and other resources. The designs can include functional modules such as master modules and slave modules. A master module can provide data to, give a task to, or otherwise control a slave module. Examples of slave modules include direct memory access (DMA) controllers, I/O units, and buffers, such as FIFO buffers. Examples of master modules include processors and other controllers.

A typical embedded system can include multiple master modules and multiple slave modules. Each master module can communicate with one or more slave modules. Each slave module can be accessible by one or more master modules.

Connectivity between various master modules and slave modules can be achieved using shared buses, or by using point-to-point interconnections between the master modules and slave modules. Prior design tools used a single type of connection between master module and slave modules. In the case of a shared bus connection, arbitration logic is typically shared between all masters and is located in the bus. In the case where point-to-point interconnection is used between the master and slaves, arbitration is typically performed on the slave side, thereby aiding simultaneous multi-master transfers. Shared buses typically only allow one transfer to be active at a time. This limits total bandwidth of the system to the bandwidth of the bus. In point-to-point interconnection schemes, however, parallelism of transfers enables the total system bandwidth to be much higher.

Arbitration on the slave side, however generally consumes more logic resources than a centrally arbitrated shared bus. Every slave that is accessed by more than one master implements its own arbitration logic. When there are many such slaves accessed by multiple masters, the logic consumed for arbitration can be large. In the case of a shared bus, however, only one instance of arbitration logic may be required, leading to reduced area requirements. It is desirable to provide a system for arbitration between a master and slave that optimizes the use of resources.

SUMMARY

Embodiments of the present invention use constraints to select whether arbitration logic is to be located at a bus, such as in a centrally arbitrated bus design, or in a slave module, such as in a point-to-point interconnection scheme. In one embodiment, synthesis tools can automatically construct a design with arbitration logic at the bus, or alternatively within the slave modules depending on one or more design constraints.

Arbitration logic can be any logic that allows multiple master modules to access the same resource such as a bus or a slave module. A number of different constraints can be used to select where the arbitration logic is located. For example, area constraints can concern the use of the PLD resources in different designs. Throughput constraints can concern the total bandwidth between the master module and the slave modules. Latency constraints can concern the speed of the data transfer between the master module and the slave modules.

BRIEF DESCRIPTION OF THE DRAWINGS

Further details of the present invention are explained with the help of the attached drawings in which.

DETAILED DESCRIPTION

Figure 1:
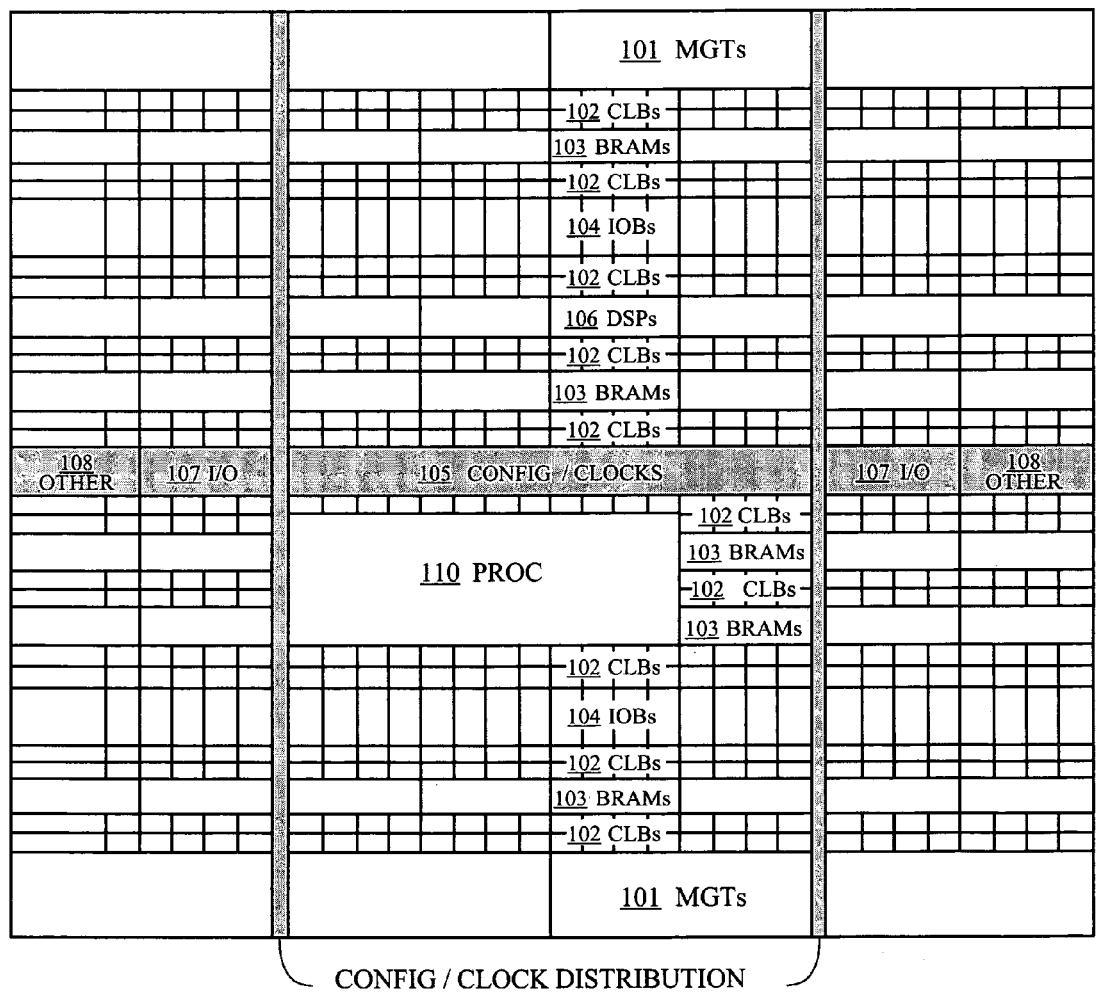
FIG. 1 illustrates components included in an FPGA.

FIG. 1 provides an overview of components included in an exemplary FPGA 100 that may be configured or programmed using embodiments of the present invention. Although it is contemplated that embodiments of the present invention may be used with other types of PLDs, for purposes of illustration, embodiments will be described with respect to n FPGA as illustrated in FIG. 1. Embodiments of the present invention may also be used with other types of programmable integrated circuits, such as integrated circuits including a microprocessor, or an integrated circuit that is partially programmable. The components may include a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. The FPGA may also include one or more dedicated processor blocks (PROC 110), and may be configured with one or more soft processors. In one embodiment, master and slave modules, any buses, and the arbitration logic may be implemented using components of an FPGA. The FPGA of FIG. 1 may be used in an embedded device, but the present invention is not limited to use in an embedded device.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are also purely exemplary.

Figure 2A:
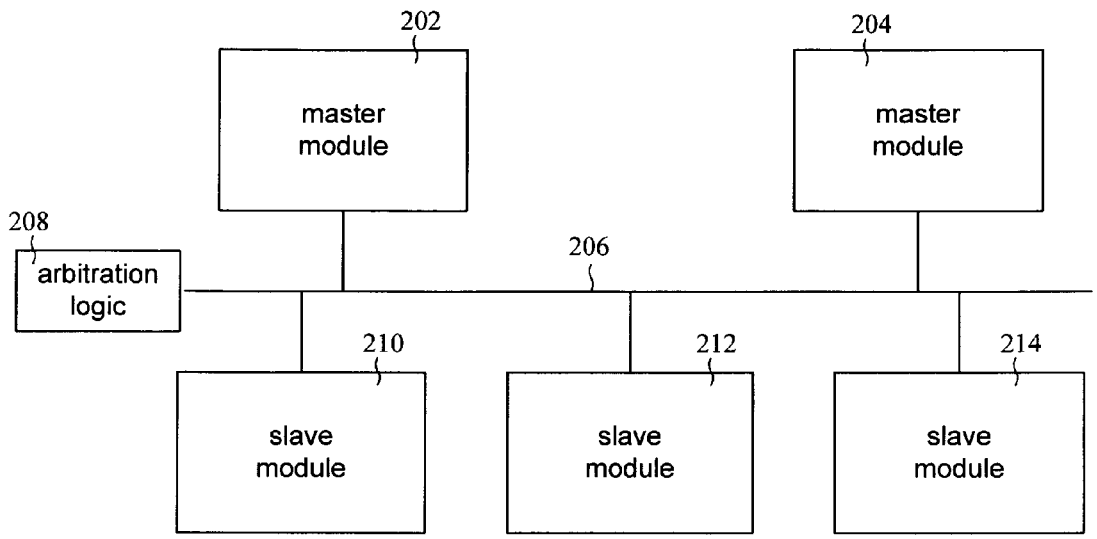
FIGS. 2A and 2B illustrate the arrangement of arbitration logic associated with the bus or with the slave module.
Figure 2B:
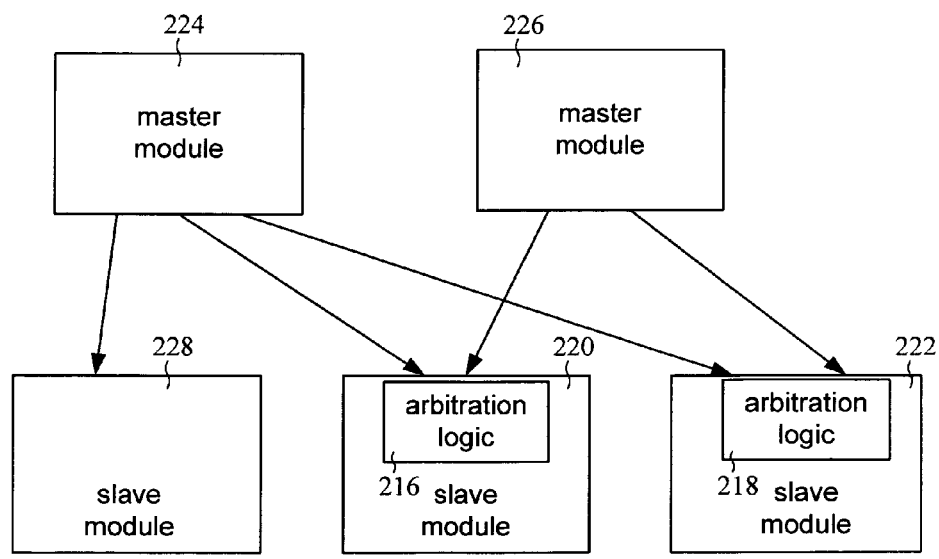

FIGS. 2A and 2B illustrate the use of arbitration logic in systems with multiple master modules and slave modules. Arbitration logic typically includes an access grant scheme that provides one of the masters access to the shared resource (e.g., a slave), and associated logic to forward the data and control signals from the granted master to the shared resource. In a centrally arbitrated bus design, accesses by the master modules to the slave modules are routed through the bus. The bus does the arbitration between various master modules and grants access to a particular master module. The master module may then access any slave module connected to the bus. This technique is based on a centralized bus system with arbitration logic. When there are multiple master modules in the system, arbitration may be performed for every access and hence access latencies can increase.

In the system of FIG. 2A, each of the master modules 202 and 204 use the bus 206 which is associated with arbitration logic 208 to access any of the slave modules 210, 212 and 214. The arbitration logic 208 ensures that the master modules 202 and 204 do not conflict with each other when they send data over the bus 206. Since only one master module 202 or 204 can use the bus 206 at any one time, this can limit the effective system throughput. For example, if each link has a maximum throughput of 100 MB/s, then using a bus can limit the total data transfer between the master modules and the slave modules to 100 MB/s.

The arbitration may also be performed on the slave side. This enables multiple master modules to simultaneously transfer data to different slave modules. In the case where point-to-point interconnection is used between the master module and slave modules, arbitration may be performed on the slave side, thereby enabling simultaneous multi-master module transfers.

FIG. 2B illustrates an example in which the arbitration logic 216 and 218 are in slave modules, such as slave modules 220 and 222. In general, arbitration logic may be placed in each of the slave modules that can be accessed by more then one master module. Thus, in the example shown in FIG. 2B, slave module 228 does not contain arbitration logic since slave module 228 only interacts with the single master module 224.

In the example of FIG. 2B, both slave modules 220 and 222 are accessed by the master modules 224 and 226. The system of FIG. 2B may have a higher effective system throughput. For example since a central bus is not used, data can be transferred from the master module 224 to the slave module 228 at the same time data is transferred from the master module 226 to the slave module 222. If each transfer is at the same transfer rate as the bus 206 of FIG. 2A, for example 100 MB/s, the maximum total system throughput would be twice as much, for example 200 MB/s.

If a system design throughput constraint is less than 100 MB/s, either the design of FIG. 2A or FIG. 2B could be used. But if the total system throughput constraint is greater than 100 MB/s, only the design of FIG. 2B could be used since only the design of FIG. 2B has a system throughput greater than 100 MB/s. Furthermore, a centrally arbitrated system such as the design of FIG. 2A may have higher latency than a slave module arbitrated system such as the design of FIG. 2B. Thus, if the latency is a critical consideration, the arbitration system of FIG. 2B may be chosen.

As discussed below, placing the arbitration logic in the slave modules can result in a higher required area since it is possible that multiple arbitration logic units are required, as opposed to a single arbitration logic unit when the arbitration logic is associated with a bus. That is, when placing the arbitration logic in the slave modules, each slave that can be accessed by multiple master modules may require its own arbitration logic. Thus, if area is a critical consideration, a bus-centric arbitration system, such as the one shown in FIG. 2A, may be chosen.

In the example of an FPGA, the area constraint can concern the use of additional FPGA resources which roughly corresponds to additional "real estate" used on the FPGA. For a highly connected system, a central arbitrated system may have significantly less required area. This area is estimated in the examples illustrated in FIGS. 3A and 3B and described below, with the area determined by the number of components required by a design. In the examples described for FIGS. 3A and 3B, the components assumed to be included in the master or slave modules may be LUTs, slices or other components that can implement a 4:1 multiplexer (mux).

Figure 3A:
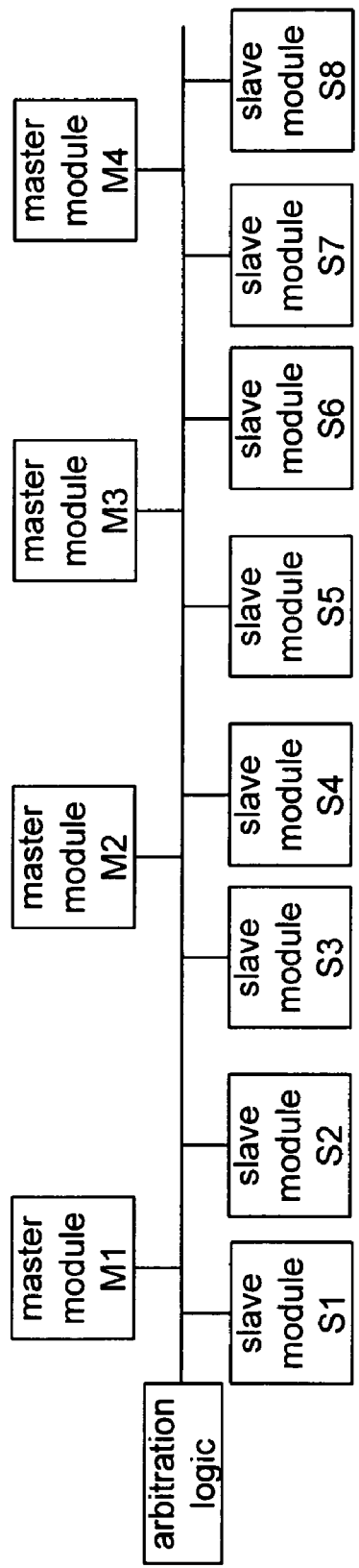
FIGS. 3A and 3B illustrate the interconnection of master and slave modules in different designs that illustrate the selection of designs due to an area constraint.
Figure 3B:
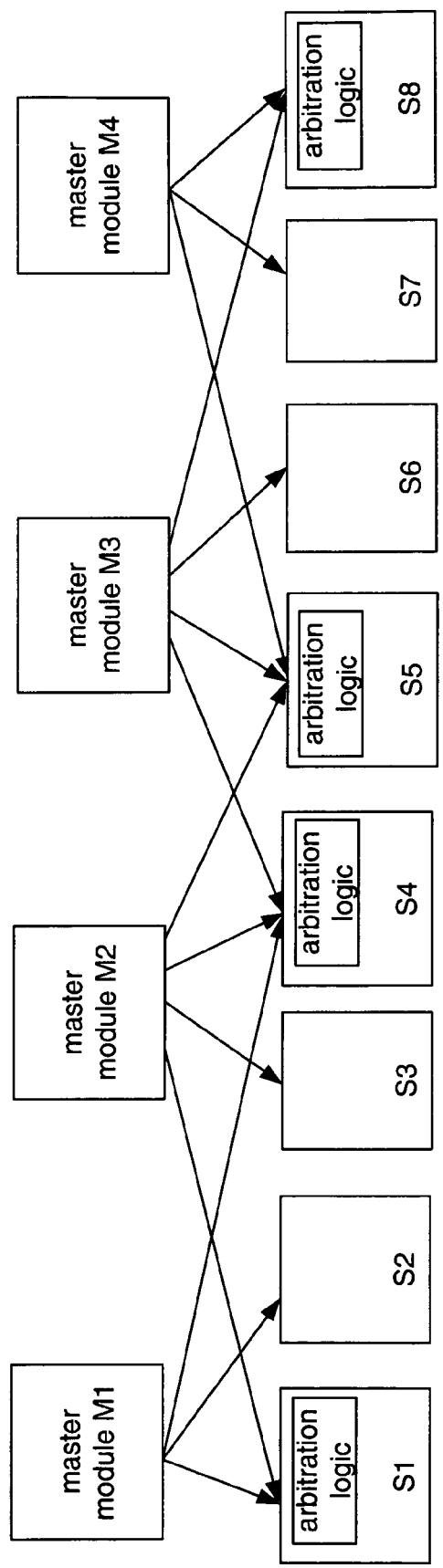

FIGS. 3A and 3B both illustrate four master modules, M1-M4, interconnected with eight slave modules, S1-S8, each having components as described above. The system of FIG. 3A provides arbitration associated with the bus, while the system of FIG. 3B has arbitration provided in slave modules. The central arbitrated bus design of FIG. 3A may result in a low area but may also result in low effective system throughput relative to the system of FIG. 3B. The area used with the example of FIG. 3A is tabulated below in items a-c, while system throughput is shown at item d.
  a. Bus Arbiter Area=1*8=8 components (single bus arbitration logic unit)
  b. Master module read 32-bit 8×1 mux area=1*32*2=64 components
  c. Slave module read 32-bit 4×1 mux area=1*32*1=32 components Total area=104 components
  d. Effective system throughput=100 MB/s The system of FIG. 3B with arbitration in the slave units has a higher effective throughput but also a greater area. The total area for the example of FIG. 3B is tabulated in items a-d, while the system throughput is shown in item e.
  a. Arbiter area=4*8=32 components (four arbitration logic units, one in each slave module connected to multiple master modules: slave modules S1/S4/S5/S8)
  b. M1/M2/M3/M4 read 32-bit 3×1 mux area=4*32*1=128 components
  c. S1/S8 read 32-bit 2×1 mux area=2*32*1=32 components
  d. S4/S5 read 32-bit 3×1 mux area=2*32*1=32 components Total Area=224 components
  e. Effective system throughput=400 MB/s Note that the examples of FIGS. 3A and 3B are merely simplified examples using a 4:1 mux as a basic block to implement arbitration and multiplexer logic. In some embodiments, various other configurable resources may be used to implement the arbitration logic. The examples merely illustrate the relative advantages, with respect to performance and area, of designs having bus-centric arbitration (FIG. 3A) and designs having arbitration in the slave units (FIG. 3B). If the area constraint is important for the design relative to system throughput, then the system of FIG. 3A may be used. Alternately, the design of FIG. 3B may be used if the total throughput or the latency is a more important consideration than the number of components (or area) used.

Figure 4:
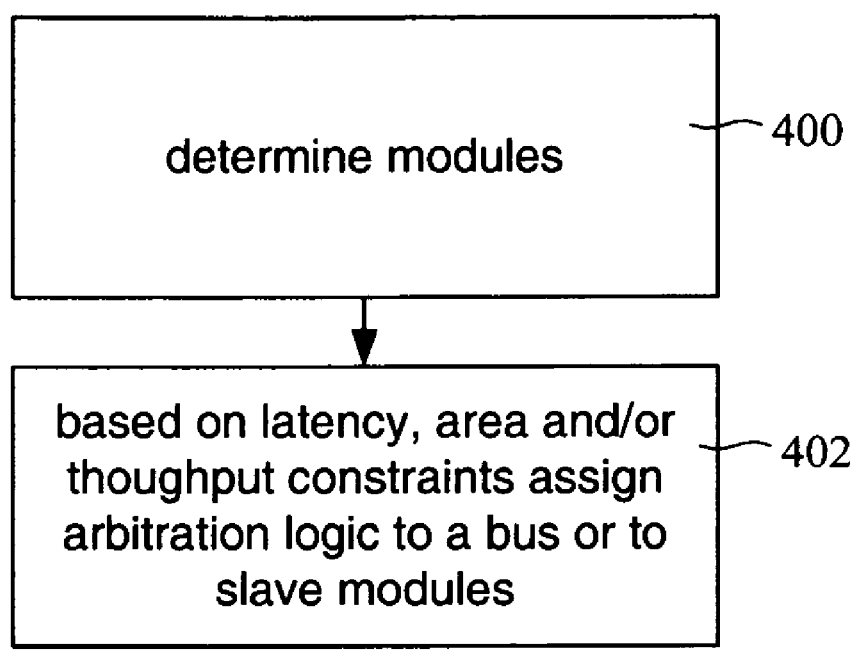
FIG. 4 is a flow chart of an embodiment of the present invention.

FIG. 4 shows steps for one embodiment of the present invention. In step 400 the master and slave modules are determined. In step 402 based on at least one of latency constraints, area constraints or throughput constraints, arbitration logic can be assigned to the bus or to the slave modules.

Figure 5:
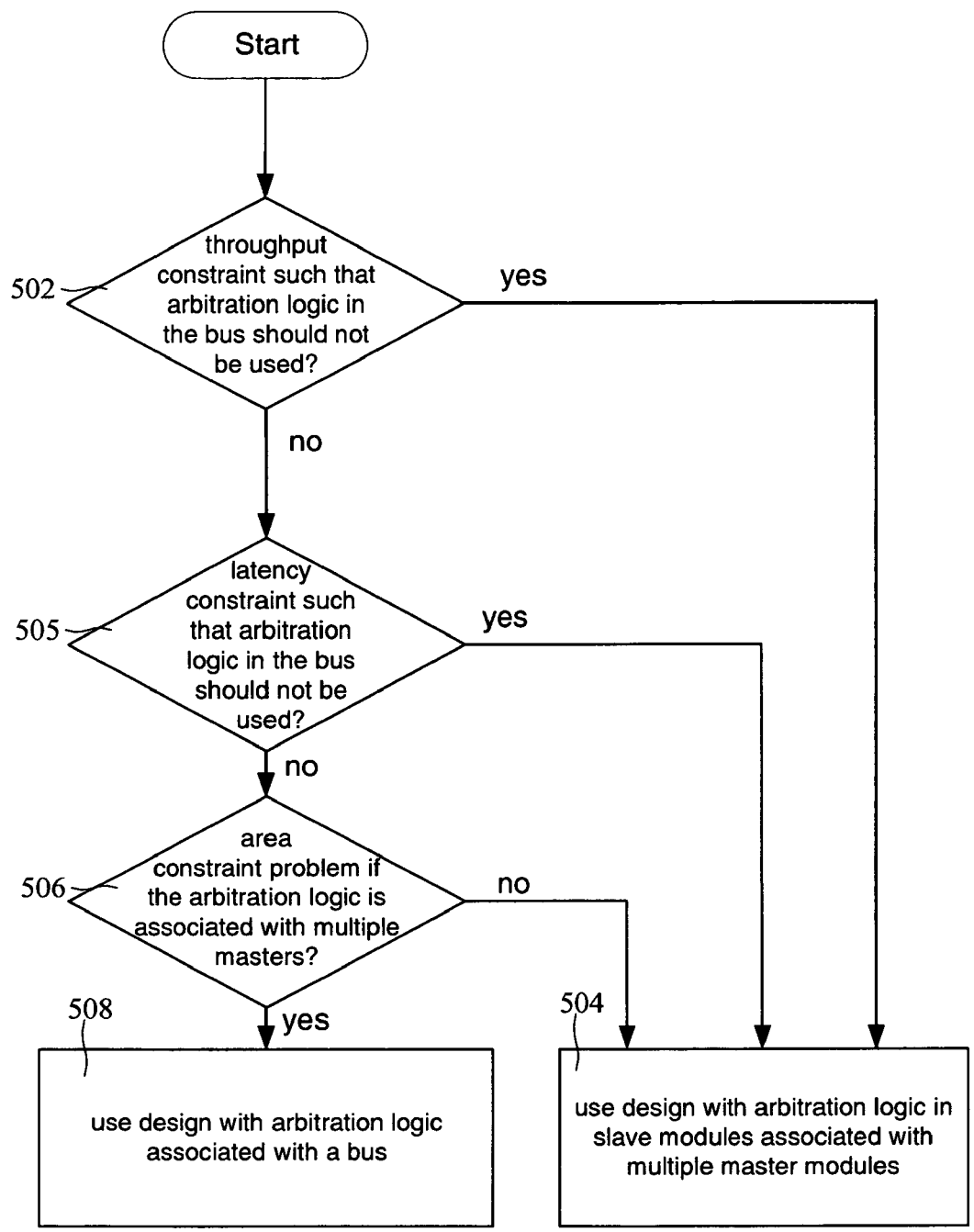
FIG. 5 is a flow chart of an embodiment of the present invention illustrating the use of the constraints to select a design.

FIG. 5 is a flowchart illustrating one embodiment of the system of the present invention. The method of FIG. 5 may be performed whenever more than one master module accesses a slave module. If only one master module accesses each slave module, then arbitration logic is not required and a direct interconnection can be used.

In step 502, it is tested whether there is a throughput constraint such that arbitration logic in the bus should not be used. In some cases, the throughput required by the system is greater than that which can be obtained by using arbitration logic in the bus. In that case, in step 504, the design with arbitration logic in the slave modules is used.

In step 505, it is checked whether there is a latency constraint such that the arbitration logic at the bus should not be used. A latency constraint can mean that the design needs to operate as fast as possible or that data needs to be transferred within a predetermined time for timing reasons. If arbitration logic in the bus should not be used for latency reasons, in step 504, the design with the arbitration logic in the slave module(s) is used.

In step 506, it is checked whether there is an area constraint issue if arbitration logic is associated with multiple slave modules. If so, in step 508 the design with the arbitration logic associated with the bus may be used. Alternately, the design with arbitration logic in the slave modules may be used in step 504, since it has a lower latency and can provide better throughput.

The area constraints may concern whether the design can fit on an FPGA of a certain size. For example, it is possible that a design with arbitration logic associated with a bus may result in a sufficiently small design such that the whole design can be placed on a smaller FPGA. This can reduce the cost associated with the entire system.

Note that the order or priority of the constraint testing steps shown in FIG. 5, (e.g., throughput, latency, area) is only exemplary. In general, the constraint testing may use a different default priority and may test for additional or fewer constraints. Additionally, the priority may be configurable by a user.

In one embodiment, multiple conflicting constraint test results may be relevant to a design decision. In that case, a default or configurable priority may be used or a user interface may allow a user to select the preferred constraint priority or design.

In one embodiment, when there are many slave modules accessed by multiple master modules, as long as latency and throughput considerations are not critical, a bus generator may be used to introduce arbitration logic inside the bus rather than having the arbitration logic in the slave module. This can reduce the number of arbiters from N to 1, where N is the number of slave modules that are accessed by more than one master module.

Thus, the constraint testing may be used in the bus generator to enable the user to move to a smaller (and less expensive) FPGA device if performance is not critical. Each slave module that attaches to the bus may have configuration parameters that control whether arbitration logic is included in the slave module. The bus generator may then set the configuration parameters on every slave module based on the constraints of the design. That is, if performance constraints can be met with a bus-centric arbitration scheme, the bus generator will configure the slave modules not to include any arbitration. If performance constraints cannot be met with bus arbitration, the bus generator will configure slave modules that will be accessed by multiple masters to include arbitration logic.

Figure 6:
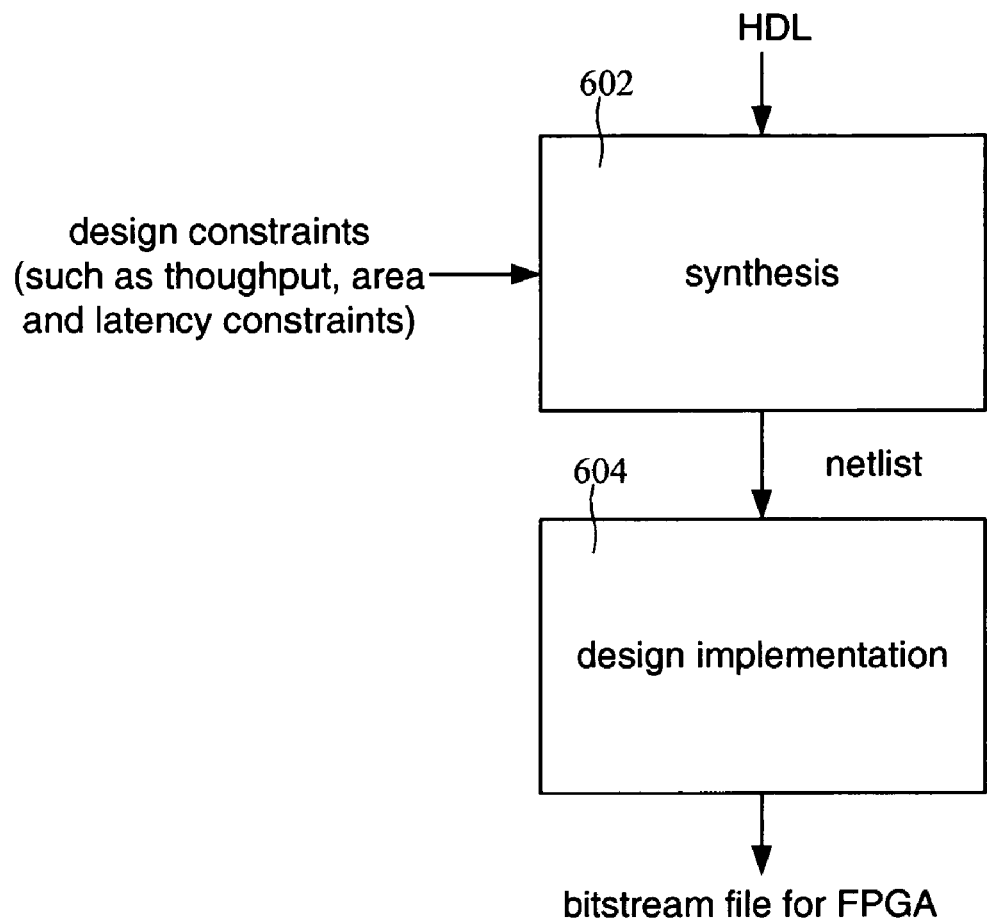
FIG. 6 illustrates the use of design tools to implement the system for embodiments of the present invention.

FIG. 6 illustrates an example of tools that can implement a system of the present invention. The tools shown include a synthesis tool 602 and design implementation tool 604. In this example, the synthesis tool 602 produces a netlist, which is later used by design implementation tool 604 to produce a bitstream for the FPGA. The design constraints may include throughput constraints, area constraints and latency constraints which may be applied or determined at the synthesis tool 602 or at another tool.

One embodiment of the present invention is a method of interconnecting master modules and slave modules on an FPGA. The method may include using at least one constraint to determine whether arbitration logic should be associated with a bus or with a slave module and producing a design with the arbitration logic associated with the bus or with the slave module.

The at least one constraint may include an FPGA area constraint, a throughput constraint, and/or a latency constraint. If an FPGA area constraint cannot be met if arbitration logic is in the slave modules, the design can be produced with arbitration logic associated with the bus. If a throughput constraint cannot be met if arbitration logic is associated with a bus, the design can be produced with arbitration logic in the slave modules. If a latency constraint cannot be met if arbitration logic is associated with a bus, the design can be produced with arbitration logic in the slave modules.

One embodiment of the present invention is a method of interconnecting master module and slave modules on an FPGA. The method may include automatically determining whether arbitration logic should be associated with a bus or with a slave module and producing a design with arbitration logic associated with the bus or with the slave module. The automatically determining step may include using at least one constraint. The at least one constraint may include an FPGA area constraint, a throughput constraint and/or a latency constraint.

One embodiment of the present invention is a computer readable memory including code adapted to do the steps of using at least one constraint to determine whether arbitration logic should be associated with a bus or with a slave module, the code producing a design having the arbitration logic associated with the bus or with the slave module.

Although the present invention has been described above with particularity, this was merely to teach one of ordinary skill in the art how to make and use the invention. Many additional modifications will fall within the scope of the invention, as that scope is defined by the following claims.

What is claimed is:

1. A method of interconnecting master module and slave modules on a programmable device comprising:
   using at least one constraint to determine whether arbitration logic will be associated with a bus or with at least one of the slave modules; and
   producing a design with the arbitration logic associated with the bus or with the at least one of the slave modules according to the at least one constraint;
   wherein the at least one constraint includes an area constraint; and
   wherein if the area constraint cannot be met with the arbitration logic in the at least one of the slave modules, the design is produced with the arbitration logic associated with the bus.

2. The method of claim 1, wherein the at least one constraint includes a throughput constraint; and
   wherein if the throughput constraint cannot be met with the arbitration logic associated with a bus, the design is produced with the arbitration logic in the at least one of the slave modules.

3. The method of claim 1, wherein the at least one constraint includes a latency constraint; and
   wherein if the latency constraint cannot be met with the arbitration logic associated with a bus, the design is produced with the arbitration logic in the at least one of the slave modules.

4. The method of claim 1, wherein the programmable device comprises a field programmable gate array (FPGA).

5. A method of interconnecting master module and slave modules on a programmable logic device comprising:

automatically determining whether arbitration logic should be associated with a bus or with at least one of the slave modules; and producing a design with arbitration logic associated with the bus or with the at least one of the slave modules based on the automatically determining;

wherein the automatically determining step includes using at least one constraint wherein the at least one constraint includes an area constraint; and wherein if the area constraint cannot be met if the arbitration logic is in the at least one of the slave modules, the design is produced with arbitration logic associated with the bus.

6. The method of claim 5, wherein, the at least one constraint includes a throughput constraint; and wherein if the throughput constraint cannot be met if the arbitration logic is associated with the bus, the design is produced with the arbitration logic in the at least one of the slave modules.

7. The method of claim 5, wherein, the at least one constraint includes a latency constraint; and wherein if the latency constraint cannot be met if the arbitration logic is associated with the bus, the design is produced with arbitration logic in the at least one of the slave modules.

8. The method of claim 5, wherein the programmable device comprises a field programmable gate array (FPGA).

9. A computer readable memory including code adapted to perform the steps of:

using at least one constraint to determine whether arbitration logic should be associated with a bus or with a slave module; and producing a design with the arbitration logic associated with the bus or with the slave module according to the at least one constraint;

wherein the at least one constraint includes an area constraint; and wherein if the area constraint cannot be met the arbitration logic in the slave module, the design is provided with the arbitration logic associated with the bus.

10. The computer readable memory of claim 9, wherein the code is part of a synthesis tool.

11. The computer readable memory of claim 9, wherein the code is part of a bus generator tool that introduces arbitration logic in the bus when system throughput parameter limits are below a predetermined level.

12. The computer readable memory of claim 9, wherein the arbitration logic is instantiated in a field programmable gate array (FPGA).

13. A method of interconnecting master module and slave modules on a programmable device comprising:

using at least one constraint to determine whether arbitration logic will be associated with a bus or with at least one of the slave modules; and producing a design with the arbitration logic associated with the bus or with the at least one of the slave modules according to the at least one constraint;

wherein the at least one constraint includes a throughput constraint; and wherein if the throughput constraint cannot be met with the arbitration logic associated with a bus, the design is produced with the arbitration logic in the at least one of the slave modules.

14. A method of interconnecting master module and slave modules on a programmable device comprising:

using at least one constraint to determine whether arbitration logic will be associated with a bus or with at least one of the slave modules; and producing a design with the arbitration logic associated with the bus or with the at least one of the slave modules according to the at least one constraint;

wherein the at least one constraint includes a latency constraint; and wherein if the latency constraint cannot be met with the arbitration logic associated with a bus, the design is produced with the arbitration logic in the at least one of the slave modules.

15. A computer readable memory including code adapted to perform the steps of:

using at least one constraint to determine whether arbitration logic should be associated with a bus or with a slave module; and producing a design with the arbitration logic associated with the bus or with the slave module according to the at least one constraint;

wherein the at least one constraint includes a throughput constraint; and wherein if the throughput constraint cannot be met the arbitration logic in the slave module, the design is provided with the arbitration logic associated with the bus.

16. A computer readable memory including code adapted to perform the steps of:

using at least one constraint to determine whether arbitration logic should be associated with a bus or with a slave module; and producing a design with the arbitration logic associated with the bus or with the slave module according to the at least one constraint;

wherein the at least one constraint includes a latency constraint; and wherein if the latency constraint cannot be met the arbitration logic in the slave module, the design is provided with the arbitration logic associated with the bus.

* * * * *